United States Patent
Chatterjee et al.

(10) Patent No.: US 9,705,021 B2
(45) Date of Patent: Jul. 11, 2017

(54) AERODYNAMIC SOLAR PODS

(71) Applicant: International Business Machines Corporation, Armonk, NY (US)

(72) Inventors: Aveek N. Chatterjee, Bangalore (IN); Kota V. R. M. Murali, Bangalore (IN); Ninad D. Sathaye, Pune (IN); Rajesh Sathiyanarayanan, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 225 days.

(21) Appl. No.: 14/527,878

(22) Filed: Oct. 30, 2014

(65) Prior Publication Data

US 2016/0126393 A1   May 5, 2016

(51) Int. Cl.

| | |
|---|---|
| *H01L 31/044* | (2014.01) |
| *H01L 31/054* | (2014.01) |
| *H01L 31/048* | (2014.01) |
| *H02S 20/10* | (2014.01) |
| *H02S 20/32* | (2014.01) |
| *H02S 20/30* | (2014.01) |
| *H02S 40/42* | (2014.01) |
| *H02S 20/20* | (2014.01) |
| *F24J 2/46* | (2006.01) |
| *F24J 2/12* | (2006.01) |

(52) U.S. Cl.
CPC ........ *H01L 31/0547* (2014.12); *F24J 2/4641* (2013.01); *F24J 2/4652* (2013.01); *H01L 31/048* (2013.01); *H02S 20/10* (2014.12); *H02S 20/20* (2014.12); *H02S 20/30* (2014.12); *H02S 20/32* (2014.12); *H02S 40/425* (2014.12); *F24J 2/12* (2013.01); *Y02E 10/52* (2013.01); *Y02E 10/544* (2013.01)

(58) Field of Classification Search
CPC ....... H01L 31/00–31/078; Y02E 10/50–10/60; H02S 10/00–10/40; H02S 20/00–20/32; H02S 30/00–30/20; H02S 40/00–40/44; H02S 50/00–50/15
USPC .................................. 136/243–265
See application file for complete search history.

(56) References Cited

U.S. PATENT DOCUMENTS

| 4,691,075 A | 9/1987 | Murphy |
|---|---|---|
| 8,330,296 B2 | 12/2012 | Ottman |
| (Continued) | | |

FOREIGN PATENT DOCUMENTS

| CN | 101942921 A | 1/2011 |
|---|---|---|
| JP | 2010097973 A | 4/2010 |
| WO | 2016067191 A1 | 5/2016 |

OTHER PUBLICATIONS

Solar System for Base Station 3KW, EPINAV LTD, www.epinav.com, New York, NY, USA, 6 pages.

(Continued)

*Primary Examiner* — Bach Dinh
(74) *Attorney, Agent, or Firm* — L. Jeffrey Kelly; Douglas M. Crockatt

(57) ABSTRACT

A solar pod system, comprising of an oval transparent enclosure. The oval transparent enclosure encapsulates a circular paraboloidal reflector mounted on solar cell. The solar cell extends over the circular parabolic reflector to place the focus of the paraboloidal reflector on the solar cell, whereby the solar cell receives light reflected by the circular parabolic reflector.

12 Claims, 4 Drawing Sheets

(56) References Cited

U.S. PATENT DOCUMENTS

| | | | |
|---|---|---|---|
| 2007/0023079 A1* | 2/2007 | Mills | F24J 2/06 136/246 |
| 2010/0078492 A1* | 4/2010 | Cislo | F24F 7/06 236/49.3 |
| 2010/0218817 A1* | 9/2010 | Guha | F24J 2/067 136/256 |
| 2010/0289269 A1 | 11/2010 | Christy et al. | |
| 2011/0247682 A1* | 10/2011 | Harper | H01L 31/048 136/251 |
| 2011/0265852 A1 | 11/2011 | Loeckenhoff et al. | |
| 2012/0180849 A1 | 7/2012 | Bettencourt et al. | |
| 2012/0228883 A1 | 9/2012 | Cwik et al. | |
| 2013/0037080 A1* | 2/2013 | Helfan | F24J 2/523 136/245 |
| 2013/0118555 A1* | 5/2013 | Samuels | H01L 31/058 136/248 |

OTHER PUBLICATIONS

Kumar et al, "Design of Steel Structures", Indian Institute of Technology Madras, http://nptel.ac.in/courses/IIT-MADRAS/Design_Steel_Structures_II/6_microwave_towers/6_examples.pdf, accessed on Oct. 28, 2014, 32 pages.

Kumar et al, "Design of Steel Structures", Indian Institute of Technology Madras, http://nptel.ac.in/courses/IIT-MADRAS/Design_Steel_Structures_II/7_transmission_towers/4_tower_design.pdf, accessed on Oct. 28, 2014, 49 pages.

Wikipedia, "Cool Earth Solar", http://en.wikipedia.org/wiki/Cool_Earth_Solar#Technical_details, accessed on Oct. 28, 2014, 3 pages.

Kazem et al., "Effect of Dust Deposition on the Performance of Multi-Crystalline Photovoltaic Modules Based on Experimental Measurements", International Journal of Renewable Energy Research vol. 3, No. 4, 2013, pp. 850-853.

Zorrilla-Casanova, "Analysis of dust losses in photovoltaic modules", World Renewable Energy Congress 2011, Sweden, May 8-13, 2011, Link•ping, Sweden, pp. 2985-2992.

"Solar Heating Pods for Swimming Pools UK", http://www.jacksons-camping.co.uk/swimming/solarpod.htm, accessed on Oct. 28, 2014, Jacksons Leisure Supplies, Wirral, UK, 1 page.

Wikipedia, "Concentrated photovoltaics", http://en.wikipedia.org/wiki/Concentrated_photovoltaics#High_concentration_photovoltaics_.28HCP, accessed on Oct. 28, 2014, 5 pages.

Woody, "Generating electricity from a balloon", Green Wombat environment + technology, Nov. 5, 2008, 6 pages.

Maskin, "Photovoltaics Get Extreme Makeover", Industrial Equipment News, Nov. 7, 2008, 13 pages.

"The future of wind power", Cool Earth Solar, Livermore, CA, http://archive.fortune.com/galleries/2008/fortune/0810/gallery.tech_windpower.fortune/5.html, accessed on Aug. 5, 2014, 2 pages.

International Search Report and Written Opinion, International application No. PCT/IB2015/058264, Date of Mailing Feb. 2, 2016, 8 pages.

* cited by examiner

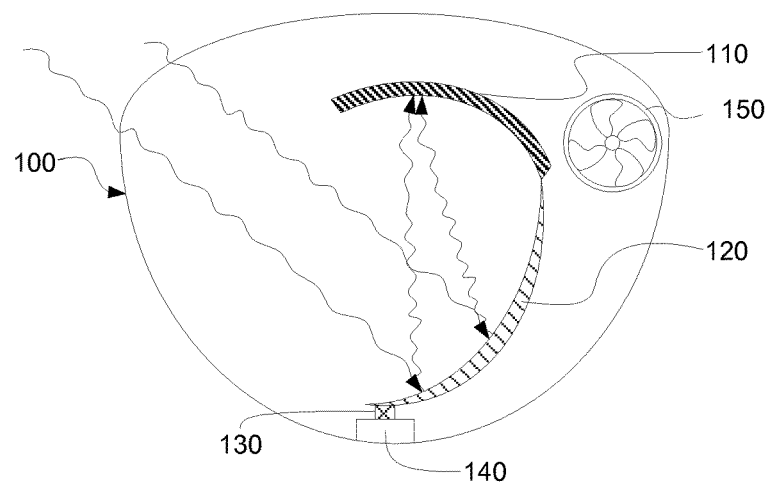
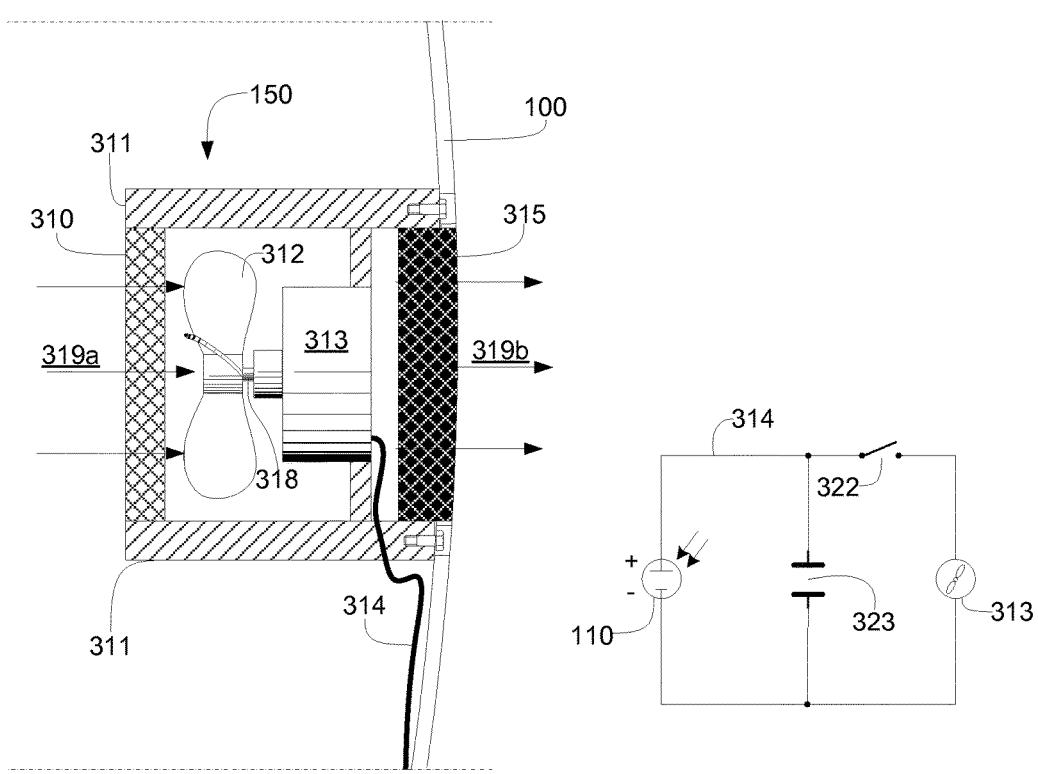
FIG. 3A
FIG. 3B
FIG. 3C

AERODYNAMIC SOLAR PODS

BACKGROUND

The present invention relates generally to the field of providing base-transceiver station (BTS), and more particularly to power-system-housing arrangements, installations, and power backup systems as well as to the generation of electrical power from solar energy.

Wireless telecommunications technology is especially attractive to remote communities lacking an existing signal wire system, and in particular to developing countries that have no or minimal telecommunications outside of major cities.

Traditionally, cellular phone tower sites are designed to use utility provided electricity as the primary source of electrical power. Telecommunications power systems include backup power arrangements to ensure continued power in the event of black-outs and other disturbances in the commercial power grid. To accomplish this, many facilities use a diesel generator. The diesel generator is then backed up by an array of valve-regulated lead-acid (VRLA) batteries. The combined arrangement—the AC electrical utility receiving equipment, diesel generator, and VRLA batteries—are all separately installed at a site. This takes up a considerable amount of space.

In general, green energy such as solar panels is utilized in limited application due to the size, shape, weight, and availability of surrounding space around the tower. BTS deployed in a developing nation's urban area may have size and weight bearing limitations. Such limitations may also prevent installation of conventional solar panels on a structure due to their mostly wind resistant shapes and limited space, which may already be utilized by generators and battery banks.

Such conventional system installations may also be time consuming and costly as each power generation component must be engineered and installed separately due to each site's individual restrictions and layout.

Further, when a site's BTS and power requirements increase over time, the engineering decisions become more complex. For example, the design engineer must decide whether to augment or replace the existing equipment.

Another problem faced by in installing cellular wireless telecommunications in developing areas is that the locations most lacking in these services also frequently lack connection to a reliable electrical power distribution infrastructure to provide power to the electronic systems.

It would be beneficial to provide a means for powering the electronics systems deployed on transmission towers as well as provide a reliable power source for communication towers and reduce the installation cost of generating electrical power by taking advantage of tower's structural infrastructure without jeopardizing the towers structural stability.

SUMMARY

Embodiments of the present invention disclose an aerodynamic solar pod system and method of mounting on elevated structures. An aerodynamic pod includes a circular paraboloidal reflector mounted to a solar cell. The solar pod's solar cell extends over the circular paraboloidal reflector to place the focus of the reflector on the solar cell. Solar pod also includes a fan, metallic leads coupled to the solar cell operable to conduct electric current generated by the solar cell to the fan, and a swivel assembly attached to the bottom of the circular paraboloidal reflector to adjust the position of the solar cell mounted to the paraboloidal reflector. The swivel cell is attached to a mounting assembly coupled to the bottom of the swivel assembly. All elements are contained within an oval transparent enclosure, wherein the oval transparent enclosure encapsulates the circular paraboloidal reflector, the solar cell, the fan, the metallic leads, the swivel assembly, and the mounting assembly.

BRIEF DESCRIPTION OF THE SEVERAL VIEWS OF THE DRAWINGS

FIG. 3A is a cross sectional view of the solar pod, in accordance with an embodiment of the present invention.

FIG. 3B is a cross sectional view of the Fan, in accordance with an embodiment of the present invention.

FIG. 3C shows an electrical circuit schematic diagram for a fan enclosed within solar pod, in accordance with an embodiment of the present invention.

DETAILED DESCRIPTION

Figure 1A:
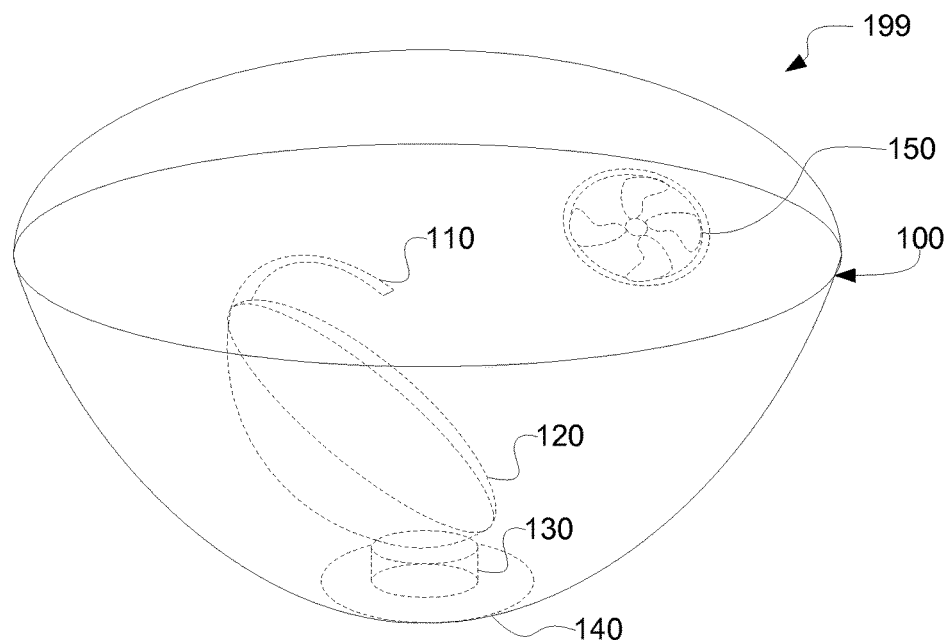
FIGS. 1A and 1B are schematic representations of side and top views of the housing of the solar pod, in accordance with an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", "symmetrical", "longitudinal", "latitudinal" and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present application is directed to a solar cell module to convert light to electricity. The solar cell module may include a housing with a plurality of lenses that form an enclosed interior space. The solar cell module may also include a plurality of solar cell receivers connected to the housing and spaced away from the plurality of lenses. In an embodiment of the invention the solar cell may include: a ceramic substrate with a first metalized surface and an opposing second metalized surface with the first metalized surface having separate conductive regions; a III-V compound semiconductor multi-junction solar cell having an anode terminal electrically connected to a first one of the conductive regions of the ceramic substrate and a cathode terminal electrically connected to a second one of the conductive regions; a bypass diode connected across the first and second conductive regions of the ceramic substrate in parallel with the solar cell. The solar cell module may be attached to a parabolic reflector and having a height above the parabolic reflector that is greater than the solar cell. A transparent enclosure may extend around and enclose the solar cell, and parabolic reflector in an interior space.

The present application is also directed to a solar cell module and may include various solar cell receivers. The solar cell receiver may include a solar cell mounted on a support and one or more III-V compound semiconductor layers. A parabolic reflector may be attached to the solar cell and mounted at the lower portion of the transparent enclosure. The optical element may define an optical channel and include an enlarged inlet that faces away from the solar cell and a reduced outlet that faces towards the solar cell. A mounting frame may be positioned over the external part of the transparent enclosure to mount upon a structure. The mounting frame may also extend around the transparent enclosure encapsulating the solar cell in an interior space. An encapsulant may be placed within the interior space between the optical element (parabolic reflector) and the transparent enclosure to lower the internal temperatures created by the parabolic reflection.

The solar cell receiver may also include a solar cell mounted on a parabolic reflector and having one or more III-V compound semiconductor layers. An optical element may be positioned under the solar cell and have an optical channel with an inlet that faces away from the solar cell and an outlet that faces towards the solar cell.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

Figure 1B:
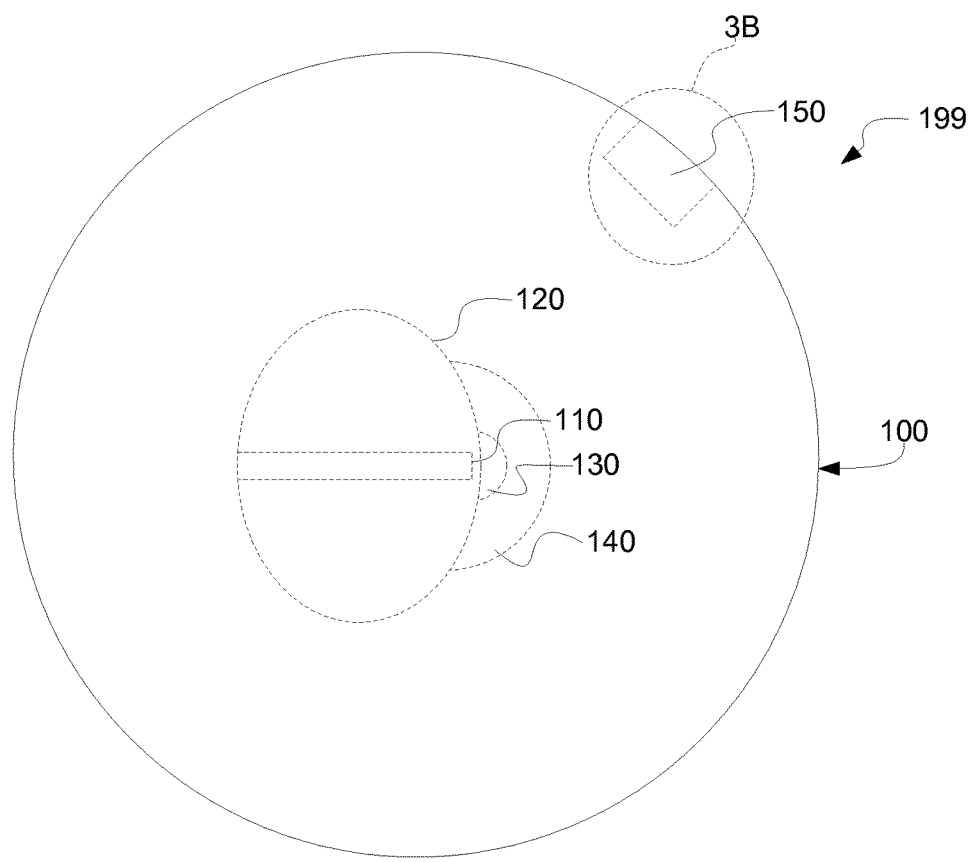

FIGS. 1A and 1B are schematic representations of side and top views of the housing of the solar pod, in accordance with an embodiment of the present invention. A solar pod 199 depicted in FIGS. 1A and 1B is of oval shape with one symmetrical axis containing an aerodynamic enclosure 100 to limit air resistance when mounted on elevated structures. The aerodynamic enclosure 100 includes a shape configured to support multidirectional airflow and is discussed in more detail in FIG. 4. The aerodynamic enclosure 100 also serves to protect the solar cell 110, and parabolic reflector 120 from exposure to outside contaminants like dust or debris. Solar cell 110 may be rigidly mounted on top of the parabolic reflector 120 as to avoid independent movement of either element. A movable swivel 130 positioned at the bottom of the parabolic reflector 120 allows for movement of the reflector and solar cell 110 as one element. Movable swivel 130 allows for rotational longitudinal movement during installation, maintenance, or adjustment of solar pod 199. Such movement may be utilized to set the parabolic reflector 120 with attached solar cell 110 to a direction allowing for maximum sun exposure. The parabolic reflector 120 may be a mirror, which focuses and concentrates solar rays onto the solar cell 110.

Movable swivel 130 is attached to a mounting bracket 140 located at the bottom section of the solar pod 199. The mounting bracket serves as a rigid attachment point between the movable swivel 130 and aerodynamic enclosure 100.

A fan 150 is attached to the aerodynamic enclosure 100. The fan 150 may be positioned within the inside section of the aerodynamic enclosure 100 as to maximize the aerodynamic shape of the enclosure. The fan 150 may be attached to the aerodynamic enclosure 100 with recessed bolts over an opening within the enclosure. An opening within the aerodynamic enclosure may supply the fan 150 with cooler ambient air for cooling, or purging the internal elements of solar pod 199. The fan 150, its elements, and electrical configurations are discussed with more detail in FIGS. 3B, and 3C.

Solar pod 199, containing the solar cell 110, a parabolic reflector 120, a fan 150, a movable swivel 130, and a mounting bracket 140 are all enclosed in a transparent aerodynamic enclosure 100. The material used for the aerodynamic enclosure 100 should be transparent as to allow solar radiation to penetrate the aerodynamic enclosure 100. Utilizing a transparent material and a shape which limits angles significantly increases solar ray exposure by limiting shadows. The oval aerodynamic enclosure 100 may be comprised of fused silica material. It should be noted that fused silica is an exemplary embodiment of the invention and that other transparent materials such as quartz, acrylic, or "Lexan" may be used for production of the aerodynamic enclosure 100.

Figure 2:
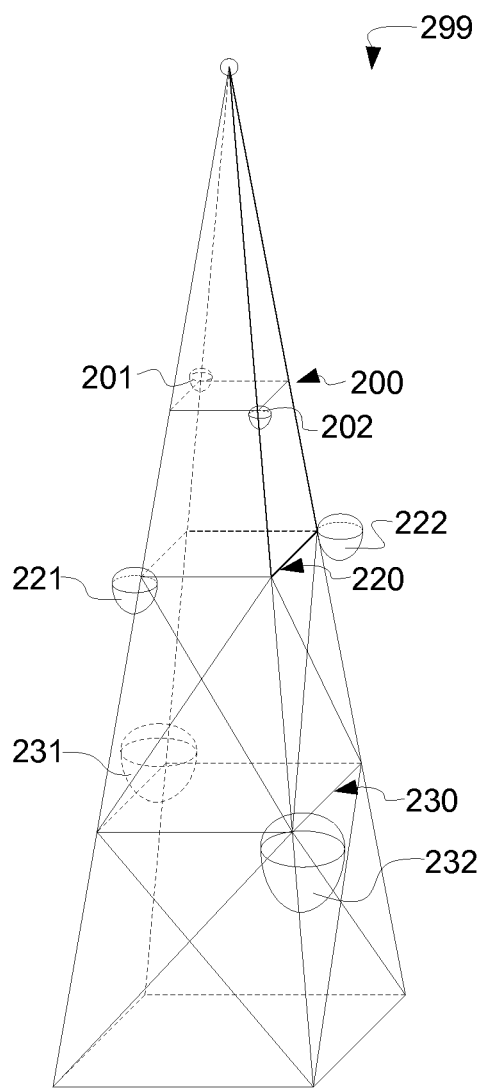
FIG. 2 is a perspective view of solar pod placement on a tower, in accordance with an embodiment of the invention.

FIG. 2 is a perspective view of solar pod placement on a tower, in accordance with an embodiment of the invention. A communication tower 299 contains variable size solar pods installed in alternating layers as to minimize the shadow effect, which would otherwise be produced if placed in a straight vertical row. The communication tower 299 may be divided into three horizontal layers representing varied elevations on the structure. A first layer 200 represents the highest elevation at which solar pods may be mounted. Solar pods 201, and 202 have the smallest diameter as compared to subsequent layers on communication tower 299. Smaller size of solar pods 202, and 201 limits the shadow, which may be cast on subsequent layers 220, and 230 as well as reduce the stress placed on the most structurally vulnerable elements of communication tower 299.

Maximum stress values exerted upon a tower structure by wind load usually affect the upper most elements of the structure. Self-weight stress values stemming from the structures truss, beam elements or equipment weight significantly decreases a tower's structural stability. Additional details regarding wind stress calculations are described in *"Structural Analysis of Guyed Steel Telecommunication Towers for Radio Antennas", J. Braz. Soc. Mech. Sci. & Eng.* 2007, Volume 29, Issue 2, and is hereby incorporated by reference in its entirety.

Smaller size of solar pods 202, and 201 significantly reduces weight exerted on the structure (self-weight stress) and limits the wind load stress values through the aerodynamic shape allowing vertical and horizontal winds to move around the solar pods without creating vortexes or breaks in the flow that cause wind load stress. A conventional flat solar panel placed at the same elevation would create exponentially more wind load acting as a wind sail due to its shape and angles.

Second layer 220 contains solar pods 221, and 222 that have a larger diameter and size than solar pods 201 and 202. As the structural strength of communication tower 299 increases at its median the exposure to wind load is decreased allowing larger diameter pods 221, and 222. As wind load generated stress in the middle of the structure is decreased, the self-weight of the structural members increases. Solar pods 221, and 222 are larger in size than that of first layer 200 but are smaller than third layer 230. The medium sized solar pods (solar pods 221 and 222) should contain a smaller diameter than those on third layer 230 in order to limit the weight addition to the self-weight stress values of the structure and to minimize shadow effects. In order to maximize power production the size of the pods and solar cells should also be increased. Although it is preferable that all solar pods receive the maximum solar radiation possible, in certain locations, solar cells and parabolic reflectors on pods located on the second layer 220 and third layer 230 should be adjusted to face the Sun's path in order to maximize power production. Solar pods 201, 202, 221, 222, 231, and 232 are also mounted in alternating arrangement in order to balance the weight on the structural elements of the communication tower 299, and lessen the shadow effect cast on subsequent layers of solar pods. Each layer of solar pods must be installed with a setback from the row in front of it, to reduce inter-row shading losses and allow maintenance access. The spacing is highly dependent on the geographical location of the solar array, land availability, and economic constraints that may determine the economic performance of a system. Typically, the spacing may be designed to reduce inter-row shading losses that occur in the early morning and late afternoon periods, this arrangement may leave the spaces between rows illuminated during the periods of highest solar resource around solar noon.

FIG. 3A is a cross sectional view of the solar pod, in accordance with an embodiment of the present invention. Solar radiation may penetrate solar pod through transparent aerodynamic enclosure 100 and strike the surface of the parabolic reflector 120. A parabolic reflector 120 may be a reflective surface, which concentrates solar radiation by transforming an incoming solar wave traveling along the axis into a spherical wave converging toward a focal point upon the solar cell 110, preferably a Compact Linear Fresnel Reflector. The shape of the parabolic reflector 120 is a three-dimensional paraboloidal shape reflecting incoming parallel wave from the axis of the dish towards a common focus/focal point. Solar radiation traveling parallel to the principal axis of a parabolic reflector 120 may be brought to a focus at the same point, no matter how far the ray is from the axis of the reflector. The parabolic reflector 120 may contain a reflector section containing a small lateral section of a much larger paraboloid. The inclined cut produces the typical elliptical shape of the Scheffler-Reflector. The sunlight that falls onto this section of the parabolic reflector is reflected sideways to the focus located at some distance from the reflector.

The axis of daily rotation may be located in north-south-direction, parallel to earth axis and runs through the center of gravity of the reflector. In such exemplary embodiment, the parabolic reflector 120 may always maintains its gravitational equilibrium and the movable swivel 130 may be utilized to synchronize it with the sun's path. The focus is located on the axis of rotation to prevent it from moving when the reflector rotates. The distance between focus and center of the reflector depends on the selected parabolic reflector 120. During the day, the concentrated light will only rotate around its own center but not move sideways in any direction. In the course of the seasons the incident angle of the solar radiation varies +/−23.5° in relation with the perpendicular to earth-axis. The parabolic reflector 120 has to perform the same change of inclination in order to stay directed at the sun. This change in inclination may be addressed by manually adjusting the movable swivel 304, which allows for movement of the parabolic reflector 120 and the solar cell 110, keeping a fixed distance between the two. The distance between the parabolic reflector 120 and the focal point located on a solar cell 110 cannot change, as it would alter the sharpness of the focal point and ultimately reduce power production of the solar pod. The distance between the parabolic reflector 120 and solar cell 110 (focal point) may be maintained by attaching both elements to each other forming a single element. In such exemplary embodiment of the invention, a movement of the parabolic reflector 120 would also correlate to the movement of the solar cell 110.

According to another embodiment of the invention, the solar cell 110 mounted to parabolic reflector 120 may be adjusted automatically. The parabolic reflector 120 may also include a guide, such as a track positioned on its base and mounted to a receiving end of the mounting bracket 140. Such guide may allow translational movement of the solar cell 110 with the parabolic reflector 120 along the base of the aerodynamic enclosure 100. The guide may include a drive element comprised of a motor connected to a gear box. The motor may be connected to a gearbox by way of a shaft, whereby the motor rotates the shaft. The gearbox may transfer the rotational motion produced by the shaft to a gear moving the solar cell 110 and the parabolic reflector 120 along the guide in a controlled motion.

In an exemplary embodiment of the invention, solar cell 110 utilized may comprise a high concentration photovoltaic (HCPV) based on its high efficiency and increased power production capability. Such exemplary HCPV may incorporate a three-junction design, where each of the three subcell p/n junctions are composed of semiconductor material with a band gap higher than the one below it. Longer solar wavelengths with lower photon energy pass through the upper subcells to be absorbed below. Efficient partitioning of the solar spectrum is obtained by allowing sunlight to be absorbed in the subcell with a band gap that best matches the particular photon energy of the wavelength.

Although the embodiments of the invention described herein are directed to a high concentration photovoltaic cell, it will be appreciated by those of skill in the art that embodiments are not limited to HCPV, but instead can be practiced with all solar cells including, but not limited to, low concentration photovoltaic cells.

FIG. 3A illustrates an exemplary embodiment of the invention where concentrated solar energy travels through free space to enter the aerodynamic enclosure 100 encapsulating the elements of the solar pod. The optically transparent aerodynamic enclosure 100, is made out of material transparent to infrared radiation, such as sapphire, fused silica, quartz, acrylic, or the like. The shape of the aerodynamic enclosure 100 is such that it reduces wind and aerodynamic load upon a structure when placed at high elevations, and serves to protect the internal components of the solar pod from ambient exposure to dust dirt and small particles that may coat the solar panels and reduce the efficiency of the solar pod. The optically transparent material and shape comprising the aerodynamic enclosure 100, also reduces shadow effects that may be cast by available planar enclosures by directly transferring solar energy through the aerodynamic enclosure 100 from any angle.

In one embodiment, the invention comprises an aerodynamic enclosure 300 that incorporates a fused silica—or fused quartz—inner shell, wherein such inner shell is substantially transmissive to the solar spectrum (around 0.3-2 micrometers), and the desired optical absorption means are preferably disposed within the interior of the shell. Rather than a cermet coating, frequently used, the embodied aerodynamic enclosure 100 may instead be coated with a low-emissivity interference filter that is substantially transparent to the solar spectrum, and that comprises materials, such as thin film alumina, zirconia, and magnesia, that provide emissivities that are comparably low to those of the prior art cermets above 500 C, preferably around epsilon=0.05-0.2.

Such fused silica materials are available and regularly used for 300-1000 C operation in the semiconductor industry, so that a well-established supply chain is available. Since fused silica is prone to devitrification above about 1000 C, its use in thermal solar applications involving temperatures higher than 1000-1100 C can be problematic; however, operation of the presently disclosed invention is preferred to be in the range of 300-1000 C, and more preferably in the range of 300 C-800 C, depending on the size of the solar pod though the subsequently embodied coatings of the invention may serve to prevent devitrification at higher temperatures than 1000 C.

The fan 150 may serve as a ventilation method contained within the interior chamber of the solar pod. The fan 150 may operate to exhaust the internal air or medium to the outside of the solar pod creating negative pressure within. It is important to note that the fan configuration can be easily substituted for other cooling means such as heat sinks or fluid cooling. For example, the fan 150 may be provided at both the inlet opening and the outlet openings to provide a constant flow of filtered, particle free air over the internal components of the solar pod.

In another embodiment of the invention, the fan may serve to exhaust outside air into the interior of the solar pod pressurizing the solar pod. Pressurizing the internal space of the solar pod prevents outside particles, such as dust, from entering the enclosure and keeping the solar parabolic reflector 120 and the solar cell 110 free from debris. The fan 150 elements and electrical wiring are discussed with more detail in FIGS. 3B and 3C.

In another embodiment of the invention, two fans may be utilized to cool down and clean the solar pod. One fan may take suction from the ambient environment blowing air through a set of filters designated to keep debris such as dust and other particles out and exhausting the filtered air into the internal space of the aerodynamic enclosure 100. A second fan may be utilized to lower the internal air pressure within the aerodynamic enclosure 100 by exhausting the filtered air to ambient environment while keeping a constant stream of filtered air circulating over the components located within the aerodynamic enclosure 100.

FIG. 3B is a cross sectional view of the fan, in accordance with an embodiment of the present invention. A shaft 318, an extension of a rotor (not shown) within the motor 313 is attached to the axial blade impeller 312. The axial blade impeller 312 includes a plurality of fan blades extending from the center and rotates about the fan's axis. The axial blade impeller 312 may be driven by a low power consumption D.C. electric motor. Motor 313 is secured to a fan housing 311 preferably within the solar pod, and is attached to the aerodynamic enclosure 100 of solar pod, to maintain the solar pod's aerodynamic characteristics.

Motor 313 may contain an electrical connection 314 to the solar cell 110 (FIG. 3A). In operation, the motor 313 rotates the fan to force airflow across the inner filter 310 and along the fan housing 311, exhausting it through outer filter 315. Further, based on the geographical location and ambient exposure to atmospheric debris, the fan housing 311 may include a plurality of filtering elements extending the inlet 319a, and outlet 319b of the fan housing 311.

In the simplest embodiment of the invention, electric power for fan 150 is provided directly by a solar cell 110 (FIG. 3A) wired in series with fan 150, and controlled by a thermostatic switch.

FIG. 3C shows an electrical circuit schematic diagram for a fan enclosed within solar pod, in accordance with an embodiment of the present invention. Solar cell 110 is connected in series with a thermostatic switch 322 and the direct current motor 313 of fan 150 through wires 314 so that the operation of fan 150 is controlled directly by the internal temperature within the solar pod by the opening and closing of the circuit by the thermostatic switch 322.

A capacitor 323 may be used to regulate the direct current voltage to the Direct Current motor of fan 150 when the thermostatic switch 322 is in the closed position, where the thermostatic switch 322 senses the internal temperature of the solar pod and activates the fan.

In an alternative embodiment of the invention, a voltage regulator may be utilized to regulate the current flowing to Direct Current motor of fan 150. Alternatively, a timer or a phototransistor with an operational amplifier may be utilized as a switch instead of thermostatic switch 322. In such embodiment, the circuit may be closed during certain hours and remain open at others.

Figure 4:
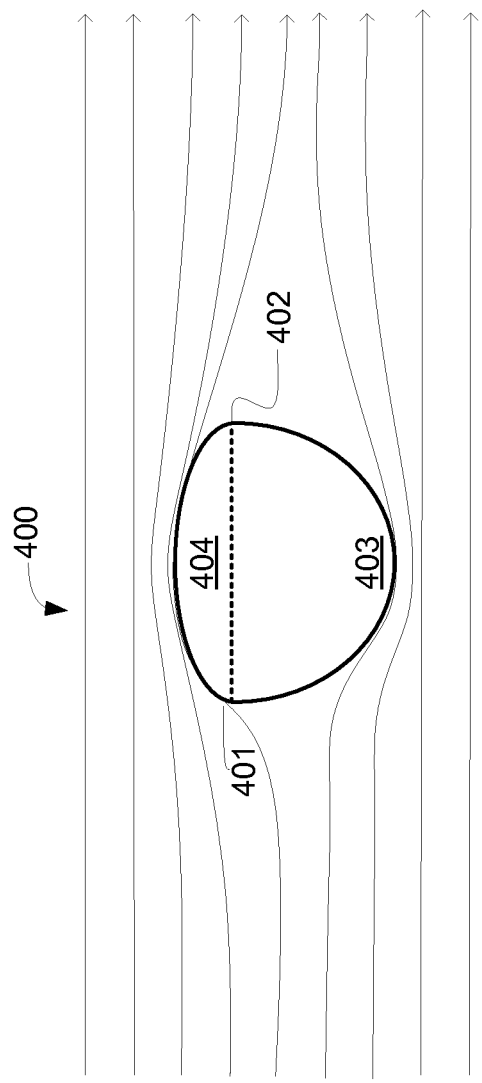
FIG. 4 depicts aerodynamic flow characteristics of a solar pod, in accordance with an embodiment of the present invention.

FIG. 4 depicts flow characteristics of solar pod, in accordance with an embodiment of the present invention. The aerodynamic shape 400 generally comprises, an essentially oval elongated circular shape with decreasing circumference towards the bottom portion 403 of the shape and rounded top curvature 404 possessing a rounded leading front edge 401 opposite to following trailing edges 402 in order to increase the aerodynamic qualities. Both, leading 401 and trailing 402 edges are circular comprising the greatest circumference of the aerodynamic shape 400. Preferably, the aerodynamic shape 400 contains only rounded circular edges to increase flow and minimize resistance. The top curvature 402 of the aerodynamic shape 400 should preferably be circular enough to create the desired flow over the top of the aerodynamic shape 400 without creating the separation in the flow and premature shock wave formation before the trailing edge 402.

The upper diameter of the aerodynamic shape 400 configuration receives the afflux flow of the wind with substantial laminar characteristics wrapping the flow around the upper and lower sections of the aerodynamic shape 400.

What is claimed is:

1. A solar pod system, comprising:
   a tower having a first elevation layer at a first height and a second elevation layer at a second height;
   a plurality of solar pods coupled to the tower, the solar pods comprising:
      an oval transparent enclosure, the oval transparent enclosure having one symmetrical latitudinal axis with a transparent surface with rounded edges and having a first end having a first end circumference and second end with a second end circumference, the first end circumference having a larger size than the second end circumference;
      one or more circular paraboloidal reflectors coupled to and encapsulated by the oval transparent enclosure, the one or more paraboloidal reflectors contained within an interior chamber of the oval transparent enclosure;
      one or more solar cells coupled to the one or more circular paraboloidal reflectors, the one or more solar cells extending over at least a portion of the one or more circular paraboloidal reflectors to place the focus of the one or more circular paraboloidal reflectors on the one or more solar cells, the one or more solar cells receiving light reflected by the one or more circular paraboloidal reflectors;
   wherein a size characteristic associated with the first end circumference and the second end circumference of each of the plurality of solar pods is inversely related to the height of the elevation layer to which each of the plurality of solar pods is coupled.

2. The solar pod system of claim 1, further comprising:
   a fan;
   metallic leads coupled to the fan and further coupled to the one or more solar cells, the metallic leads operable to conduct electric current generated by the one or more solar cells to the fan;
   one or more swivel assemblies coupled to the one or more circular paraboloidal reflectors; and
   one or more mounting assemblies coupled to the bottom of the one or more swivel assemblies.

3. The solar pod system of claim 1, wherein the one or more of solar cell comprises one or more;
   a high concentration photovoltaic cell;
   a concentrated photovoltaic cell; and
   wherein the cell is a III-V multijunction solar cell.

4. The solar pod system of claim 2, wherein the fan exhausts the air from within the interior chamber of the oval transparent enclosure for cooling the solar cell.

5. The solar pod system of claim 2, wherein the fan pressurizes the interior chamber of the oval transparent enclosure by blowing air from the outside into the oval transparent enclosure.

6. The solar pod system of claim 2, wherein the swivel assembly rotates on a latitudinal axis.

7. The solar pod system of claim 1, wherein the paraboloidal reflector comprises a Compact Linear Fresnel Reflector.

8. The solar pod system of claim 1, wherein the fan comprises:
   a first blower fan contained within the interior chamber of the oval transparent enclosure; and
   a second exhaust fan contained within the interior chamber of the oval transparent enclosure.

9. The solar pod system of claim 1, further comprising:
   a heat sink thermally coupled to the solar cell to cool the solar cell, wherein the heat sink is in direct physical and thermal contact to a thermally conductive substrate of the solar cell.

10. The solar pod system of claim 1, wherein the oval transparent enclosure further comprises a fused silica material coated with a transparent low-emissivity interference filter.

11. The solar pod system of claim 1, wherein the swivel assembly further comprises an electrical solar tracking system for aligning said paraboloidal reflector with solar movements.

12. A solar pod system, comprising:
   a tower having a first elevation layer at a first height and a second elevation layer at a second height;
   a plurality of solar pods coupled to the tower, the solar pods comprising:
      an oval transparent enclosure, the oval transparent enclosure having one symmetrical latitudinal axis with a transparent surface with rounded edges and having a first end having a first end circumference and second end with a second end circumference, the first end circumference having a larger size than the second end circumference;
      one or more circular paraboloidal reflectors coupled to and encapsulated by the oval transparent enclosure, the one or more paraboloidal reflectors contained within an interior chamber of the oval transparent enclosure;
      one or more solar cells coupled to the one or more circular paraboloidal reflectors, the one or more solar cells extending over at least a portion of the one or more circular paraboloidal reflectors to place the focus of the one or more circular paraboloidal reflectors on the one or more solar cells, the one or more solar cells receiving light reflected by the one or more circular paraboloidal reflectors;
      metallic leads coupled to the one or more solar cells operable to conduct electric current generated by the one or more solar cells;
      a fan coupled to the metallic leads, the fan further coupled to the oval transparent enclosure;
      one or more swivel assemblies coupled to the one or more circular paraboloidal reflectors; and
      one or more mounting assemblies coupled to the one or more swivel assemblies, the one or more mounting assemblies further coupled to the oval transparent enclosure;
   wherein a size characteristic associated with the first end circumference and the second end circumference of each of the plurality of solar pods is inversely related to the height of the elevation layer to which each of the plurality of solar pods is coupled.

* * * * *